(12) United States Patent
Cai et al.

(10) Patent No.: US 9,711,233 B2
(45) Date of Patent: **\*Jul. 18, 2017**

(54) SYSTEMS AND METHODS FOR SUB-ZERO THRESHOLD CHARACTERIZATION IN A MEMORY CELL

(71) Applicant: SEAGATE TECHNOLOGY LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,856

(22) Filed: Jun. 28, 2016

(65) Prior Publication Data

US 2016/0379718 A1 Dec. 29, 2016

Related U.S. Application Data

(63) Continuation of application No. 14/085,553, filed on Nov. 20, 2013, now Pat. No. 9,378,840.

(60) Provisional application No. 61/896,590, filed on Oct. 28, 2013.

(51) Int. Cl.
*G11C 16/34* (2006.01)
*G11C 29/02* (2006.01)
*G11C 29/50* (2006.01)

(52) U.S. Cl.
CPC ........ *G11C 16/3427* (2013.01); *G11C 16/349* (2013.01); *G11C 16/3418* (2013.01); *G11C 29/021* (2013.01); *G11C 29/028* (2013.01); *G11C 29/50004* (2013.01)

(58) Field of Classification Search
CPC .......................... G11C 16/349; G11C 16/3427
USPC ..................................................... 365/185.02
See application file for complete search history.

(56) References Cited

U.S. PATENT DOCUMENTS

| 5,892,896 | A | 4/1999 | Shingo |
|---|---|---|---|
| 6,516,425 | B1 | 2/2003 | Belhadj et al. |
| 6,651,032 | B2 | 11/2003 | Peterson et al. |
| 7,127,549 | B2 | 10/2006 | Sinclair |
| 7,254,692 | B1 | 8/2007 | Teoh et al. |
| 7,310,699 | B2 | 12/2007 | Sinclair |
| 7,523,013 | B2 | 4/2009 | Gorobets et al. |
| 7,596,656 | B2 | 9/2009 | Elhamias |
| 7,721,146 | B2 | 5/2010 | Polisetti et al. |

(Continued)

FOREIGN PATENT DOCUMENTS

KR 10/2009-0013394 2/2009

*Primary Examiner* — Hoai V Ho
*Assistant Examiner* — Muna A Techane
(74) *Attorney, Agent, or Firm* — Holland & Hart LLP

(57) ABSTRACT

Systems and methods relating generally to data processing, and more particularly to systems and methods for characterizing a solid state memory. In one embodiment, the systems and methods may include programming a first cell of a solid state memory device to a negative voltage, programming a second cell of the solid state memory device to a positive voltage, wherein the second cell is adjacent to the first cell, calculating a voltage shift on the negative voltage programmed to the first cell, characterizing a shifted voltage level on the first cell as an interim voltage, and subtracting the voltage shift from the interim voltage to yield an actual voltage on the first cell.

19 Claims, 5 Drawing Sheets

(56) References Cited

U.S. PATENT DOCUMENTS

| | | |
|---|---|---|
| 7,778,077 B2 | 8/2010 | Gorobets et al. |
| 8,010,738 B1 | 8/2011 | Chilton et al. |
| 8,102,708 B2 | 1/2012 | Kim |
| 8,151,137 B2 | 4/2012 | McKean et al. |
| 8,174,912 B2 | 5/2012 | Warren |
| 8,176,367 B2 | 5/2012 | Dreifus et al. |
| 8,289,768 B2 | 10/2012 | Warren et al. |
| 8,381,077 B2 | 2/2013 | Warren |
| 8,458,416 B2 | 6/2013 | Warren et al. |
| 8,499,220 B2 | 7/2013 | Warren |
| 8,560,765 B2 | 10/2013 | Warren |
| 9,013,434 B2 | 4/2015 | Hu et al. |
| 9,164,828 B2 | 10/2015 | Xia et al. |
| 9,201,729 B2 | 12/2015 | Wu et al. |
| 9,235,469 B2 | 1/2016 | Zhang et al. |
| 2002/0091965 A1 | 7/2002 | Moshayedi |
| 2003/0235080 A1* | 12/2003 | Yaegashi ............ G11C 16/3468 365/185.22 |
| 2005/0044459 A1 | 2/2005 | Scheuerlein et al. |
| 2005/0172067 A1 | 8/2005 | Sinclair |
| 2005/0204187 A1 | 9/2005 | Lee et al. |
| 2005/0209804 A1 | 9/2005 | Basso et al. |
| 2006/0181926 A1 | 8/2006 | Ema |
| 2006/0245248 A1 | 11/2006 | Hu |
| 2007/0028040 A1 | 2/2007 | Sinclair |
| 2007/0266200 A1 | 11/2007 | Gorobets et al. |
| 2008/0010557 A1 | 1/2008 | Kume |
| 2008/0046779 A1 | 2/2008 | Merchant et al. |
| 2008/0055294 A1* | 3/2008 | Yamazaki ............ G09G 3/3655 345/204 |
| 2008/0086275 A1 | 4/2008 | Astigarraga et al. |
| 2008/0162079 A1 | 7/2008 | Astigarraga et al. |
| 2008/0307270 A1 | 12/2008 | Li |
| 2009/0063895 A1 | 3/2009 | Smith |
| 2009/0067303 A1 | 3/2009 | Poo et al. |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2010/0121609 A1 | 5/2010 | Gorinevsky |
| 2010/0122148 A1 | 5/2010 | Flynn et al. |
| 2010/0306577 A1 | 12/2010 | Dreifus et al. |
| 2010/0306580 A1 | 12/2010 | McKean et al. |
| 2011/0058415 A1 | 3/2011 | Warren |
| 2011/0060862 A1 | 3/2011 | Warren |
| 2011/0060865 A1 | 3/2011 | Warren et al. |
| 2011/0069547 A1* | 3/2011 | Roohparvar ........ G11C 11/5642 365/185.03 |
| 2011/0310666 A1* | 12/2011 | Miida ................... G11C 16/10 365/185.11 |
| 2012/0102261 A1 | 4/2012 | Burger et al. |
| 2012/0110376 A1 | 5/2012 | Dreifus et al. |
| 2015/0113205 A1 | 4/2015 | Cai et al. |

* cited by examiner

SYSTEMS AND METHODS FOR SUB-ZERO THRESHOLD CHARACTERIZATION IN A MEMORY CELL

CROSS REFERENCE TO RELATED APPLICATIONS

This application is a Continuation application of U.S. patent application Ser. No. 14/085,553, filed on 20 Nov. 2013 and entitled SYSTEMS AND METHODS FOR SUB-ZERO THRESHOLD CHARACTERIZATION IN A MEMORY CELL, now U.S. Pat. No. 9,378,840, issued 28 Jun. 2016, which claims the benefit of the filing date of U.S. Provisional Application No. 61/896,590, filed 28 Oct. 2013, and entitled SYSTEMS AND METHODS FOR SUB-ZERO THRESHOLD CHARACTERIZATION IN A MEMORY CELL, the disclosures of which are incorporated, in their entireties, by this reference.

FIELD OF THE INVENTION

Systems and method relating generally to data processing, and more particularly to systems and methods for characterizing a solid state memory.

BACKGROUND

Solid state storage devices may be programmable to a number of different threshold voltages representing one or more bits. To recover data from the cells, it is necessary to distinguish between distinct threshold levels or device states representing different bit patterns. Over the life of such storage devices, the mid points between the device states drift making data recovery from the storage device more susceptible to errors.

Hence, for at least the aforementioned reasons, there exists a need in the art for advanced systems and methods for characterizing a solid state storage device.

SUMMARY

Systems and method relating generally to data processing, and more particularly to systems and methods for characterizing a solid state memory.

Various embodiments of the present invention provide memory systems that include a memory cell characterization circuit. The memory cell characterization circuit is operable to: write a first cell of a solid state memory device to a negative voltage, and write a second cell of the solid state memory device to a positive voltage. The second cell is adjacent to the first cell such that the second cell interferes with the first cell resulting in a voltage on the first cell that is the negative voltage offset by an interference voltage. The memory cell characterization circuit is further operable to: characterize a voltage level on the first cell to yield an interim voltage; and subtract the interference voltage from the interim voltage to yield an actual voltage.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1A:
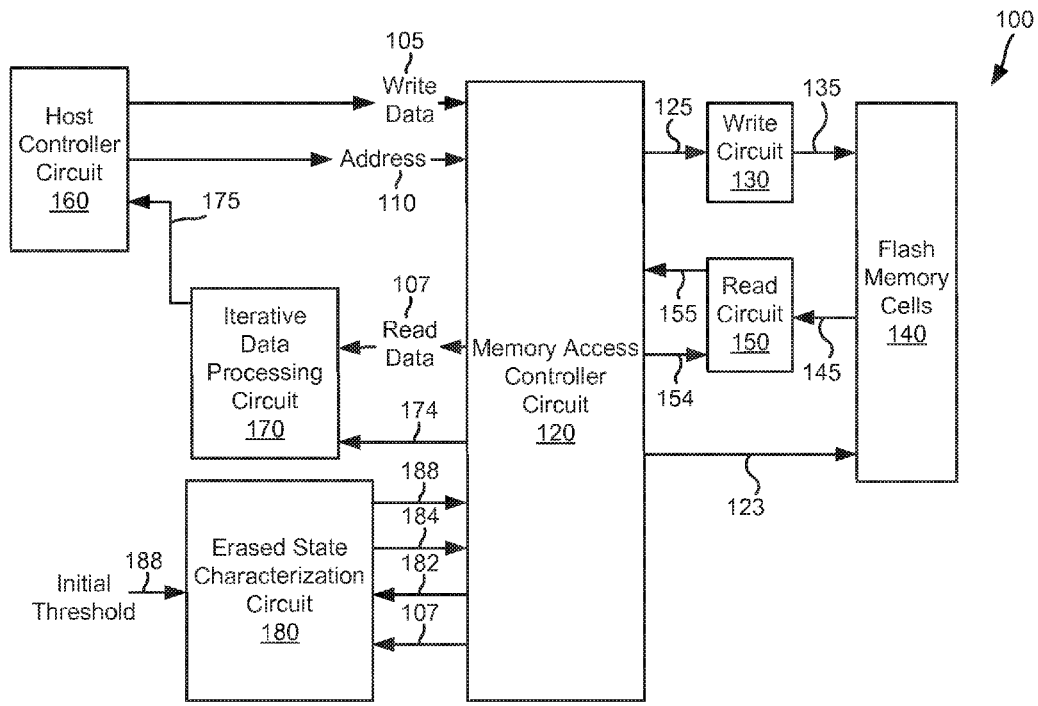
FIG. 1a shows a solid state storage device including an erased state characterization circuit in accordance with various embodiments of the present invention.

Systems and method relating generally to data processing, and more particularly to systems and methods for characterizing a solid state memory.

Various embodiments of the present invention provide memory systems that include a memory cell characterization circuit. The memory cell characterization circuit is operable to: write a first cell of a solid state memory device to a negative voltage, and write a second cell of the solid state memory device to a positive voltage. The second cell is adjacent to the first cell such that the second cell interferes with the first cell resulting in a voltage on the first cell that is the negative voltage offset by an interference voltage. The memory cell characterization circuit is further operable to: characterize a voltage level on the first cell to yield an interim voltage; and subtract the interference voltage from the interim voltage to yield an actual voltage. In various instances of the aforementioned embodiments, the actual voltage is used to set a threshold value for distinguishing between a first state and a second state of the first memory cell.

In some instances of the aforementioned embodiments, the voltage level on the first cell is a first voltage level, and the positive voltage is a first positive voltage. In such instances, the memory cell characterization circuit is further operable to: write the first cell of the solid state memory device to a second positive voltage; characterize a second voltage level on the first cell; write the second cell of the solid state memory device to a third positive voltage such that the second cell interferes with the first cell to yield the voltage on the first cell is the second positive voltage offset by the interference voltage; characterize a third voltage level on the first cell; and subtract the second voltage level from the third voltage level to yield the interference voltage. In some such cases, the interference voltage includes at least a first interference component and a second interference component, the first interference component is due to interference from the second cell on the first cell, and the second memory cell is included in a first wordline adjacent to a defined wordline including the first cell. In such cases, the memory cell characterization circuit is further operable to write a third cell of the solid state memory device to the positive voltage. The third cell is included in a second wordline adjacent to the defined wordline, and the third cell results in the second interference component interfering with the first cell. In one or more instances of the aforementioned embodiments, characterizing the first voltage on the first cell to yield the interim voltage includes repeatedly reading the first cell using different values for a first threshold voltage distinguishing between a first state and a second state of the first cell to determine when the output of the first cell changes, and characterizing the third voltage on the first cell includes repeatedly reading the first cell using different values for a second threshold voltage distinguishing between a third state and a fourth state of the first cell to determine when the output of the first cell changes. In one particular case, all of the different values of the first threshold voltage are greater than or equal to zero, and all of the different values of the second threshold voltage are greater than or equal to zero.

In one or more instances of the aforementioned embodiments, characterizing the voltage on the first cell to yield the interim voltage includes repeatedly reading the first cell using different values for a threshold voltage distinguishing between a first state and a second state of the first cell to determine when the output of the first cell changes. In some such instances, all of the different values of the threshold voltage are greater than or equal to zero.

In some instances of the aforementioned embodiments, the interference voltage includes at least a first interference component and a second interference component. The first interference component is due to interference from the second cell on the first cell, and the second memory cell is included in a first wordline adjacent to a defined wordline including the first cell. In such instances, the memory cell characterization circuit is further operable to: write a third cell of the solid state memory device to the positive voltage where the third cell is included in a second wordline adjacent to the defined wordline, and the third cell results in the second interference component interfering with the first cell.

In particular instances of the aforementioned embodiments, the memory system is implemented as part of an integrated circuit. In one particular instance, the system includes the solid state memory device and both the memory cell characterization circuit and the solid state memory device are implemented on the same integrated circuit. In some cases, the solid state memory device includes a number of flash memory cells. In particular cases, each of the flash memory cells is able to hold a charge distinguishable as two bits of data.

Other embodiments of the present invention provide methods for characterizing a solid state memory device. The methods include: writing a negative voltage to a first cell of a solid state memory device; writing a positive voltage to a second cell of the solid state memory device, where the second cell is adjacent to the first cell, and the second cell interferes with the first cell such that the voltage on the first cell is the negative voltage offset by an interference voltage; characterizing a voltage level on the first cell to yield an interim voltage; and subtracting the interference voltage from the interim voltage to yield an actual voltage.

In some instances of the aforementioned embodiments, the voltage level on the first cell is a first voltage level, and the positive voltage is a first positive voltage. In some such instances, the methods further include: writing a second positive voltage to the first cell of the solid state memory device; characterizing a second voltage level on the first cell; writing a third positive voltage to the second cell of the solid state memory device, where the second cell interferes with the first cell such that the voltage on the first cell is the second positive voltage offset by the interference voltage; characterizing a third voltage level on the first cell; and subtracting the second voltage level from the third voltage level to yield the interference voltage. In some cases, the interference voltage includes at least a first interference component and a second interference component, the first interference component is due to interference from the second cell on the first cell, and the second memory cell is included in a first wordline adjacent to a defined wordline including the first cell. In such cases, the methods may further include writing a third cell of the solid state memory device to the first positive voltage, where the third cell is included in a second wordline adjacent to the defined wordline, and the third cell results in the second interference component interfering with the first cell.

Yet other embodiments of the present invention provide electronic devices. Such electronic devices include: a solid state memory device, and a memory cell characterization circuit. The memory cell characterization circuit is operable to: write a first cell of a solid state memory device to a negative voltage; write a second cell of the solid state memory device to a positive voltage, where the second cell is adjacent to the first cell, and the second cell interferes with the first cell such that the voltage on the first cell is the negative voltage offset by an interference voltage; characterize a voltage level on the first cell to yield an interim voltage; and subtract the interference voltage from the interim voltage to yield an actual voltage.

Turning to FIG. 1a, a solid state storage device 100 including an erased state characterization circuit 180 in accordance with various embodiments of the present invention. Storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
| --- | --- |
| '11' | V3 |
| '10' | V2 |
| '00' | V1 |
| '01' | V0 |

Where V3 is greater than V2, V2 is greater than V1, and V1 is greater than V0. It should be noted that the aforementioned table is merely an example, and that different devices may assign different bit values to the different voltage thresholds. For example in other cases the values in the following table may be used:

| Two Bit Data Input | Voltage Output |
| --- | --- |
| '01' | V3 |
| '00' | V2 |
| '10' | V1 |
| '11' | V0 |

Of course, other bit patterns may be assigned to different thresholds.

A data read is effectuated when host controller circuit 160 provides address 110 along with a request to read data from the corresponding location in flash memory cells 140. Memory access controller 120 accesses a read voltage 145 from locations indicated by address 123 and compares the voltage to a number of threshold values 154 to reduce the voltage to a multi-bit read data 155. Using the same two bit example, the following multi-bit read data 155 results:

| Voltage Input | Two Bit Data Output |
| --- | --- |
| >V2 | '11' |
| >V1 | '10' |
| >V0 | '00' |
| <=V0 | '01' |

This multi-bit read data 155 is provided from memory access controller 120 to data processing circuit 170 as read data 107. Iterative data processing circuit 170 applies a data decoding algorithm to read data 107 using soft data 173 that is either accessed or generated by memory access controller circuit 120. Soft data may either be provided from flash memory cells 140 where such are available, or may be generated by memory access controller circuit 120. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Iterative data processing circuit 170 repeatedly applies a data decoding algorithm to read data 107 and soft data 174 to yield a decoded output. Where the decoded output converges (i.e., results in a correction of all remaining errors in read data 107), the decoded output is provided as read data 175. Where the decoded output fails to converge (i.e., errors remain in the decoded output), another iteration of the data decoding algorithm is applied to read data 107 guided by the previous decoded output to yield an updated decoded output. This process continues until either all errors are corrected or a timeout condition occurs (e.g., 100 iterations). In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention.

Figure 2:
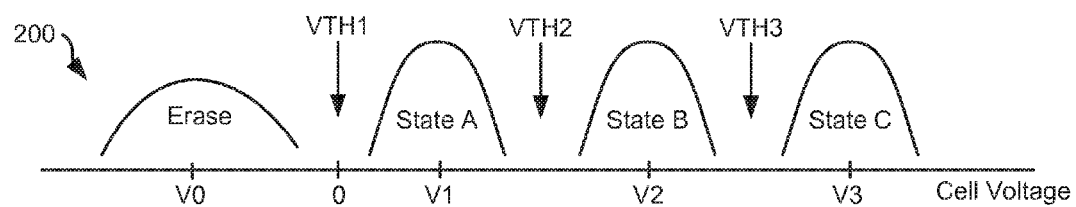
FIG. 2 graphically depicts voltage distribution and mid-state thresholds for a two bit memory device.

Voltage thresholds 154 may be changed from time to time to reflect the changes in flash memory cells 140. Turning to FIG. 2 a voltage distribution 200 for a two bit memory device is shown. This two bit memory device represents respective cells of flash memory cells 140. It should be noted that voltage distribution 200 is merely an example, and that other distributions are possible in accordance with different embodiments of the present invention. Further, it should be noted that flash memory cells 140 are not limited to two bit memory cells, and that various embodiments of the present invention may utilize single bit or three or more bit memory cells. As shown, voltage distribution 200 exhibits four voltage states (ERASE, STATE A, STATE B, and STATE C) each distinguishable using a respective voltage threshold (VTH1, VTH2, VTH3) located at a midpoint between a respective voltage state. As an example, the ERASE state may represent a '00', STATE A may represent a '01', STATE B may represent a '11', and STATE C may represent a '10'. Over time, the mid-point between the voltage states may change making it more difficult to discern one state from another. To mitigate this increased difficulty, the threshold voltages may be adjusted after a defined number of program/erase cycles of flash memory cells 140. The STATE A, STATE B and STATE C are all positive voltages making the characterization of the upper thresholds (VTH2, VTH3) straightforward. These thresholds may be characterized by memory access controller circuit using any circuitry and/or methods known in the art.

In contrast, the ERASE state is a negative voltage requiring sub-zero threshold characterization performed by erased state characterization circuit 180. To define the sub-zero threshold, erased state characterization circuit 180 receives a set of initial thresholds 188 that are defined thresholds guaranteed to read to one side of a mid-state between adjacent states, a P/E cycle input 182 provided from memory access controller circuit 120 and indicating the occurrence of a program and erase cycle, and read data 107. In addition, erased state characterization circuit 180 provides a re-read control 184 provided to memory access controller 120 to control reading and re-reading of a defined area of flash memory cells 140, and an updated set of thresholds 186.

As there is not a direct way of programming VTH1 of voltage thresholds 154 to a negative voltages, erased state characterization circuit 180 relies on inter-cell interference in flash memory cells to shift the ERASE state to a non-zero voltage. With the ERASE state shifted to a non-negative voltage, an interim value of VTH1 can be characterized by repeatedly reading the cells in the shifted erase state using a different VTH1 provided as voltage thresholds 154 to determine the transition between states. In this way, the voltage corresponding to the approximate mid-point between the ERASE state and STATE A can be determined for the shifted ERASE state. As the inter-cell interference can be calculated, the shift in the ERASE state due to inter-cell interference is a known voltage shift. By subtracting the known voltage shift from the voltage corresponding to the approximate mid-point between the ERASE state (e.g., '00') and STATE A (e.g., '10') for the shifted ERASE state, the voltage corresponding to the approximate mid-point between the ERASE state and STATE A for the non-shifted ERASE state can be calculated.

The known voltage shift can be obtained by programming the cells of one wordline to be in STATE B (e.g., '11') and programming cells on wordlines on both sides to be in STATE C (e.g., '10') resulting in an inter-cell interference based shift of the cells programmed at STATE B toward STATE C. The cells programmed at STATE B can then be repeatedly read using different values of VTH3 provided as voltage thresholds 154 to determine the change in the previously determined value for VTH3 transition between states. The difference between the newly determined value for VTH3, and the previously determined value for VTH3 is the previously mentioned known voltage shift.

Figure 4:
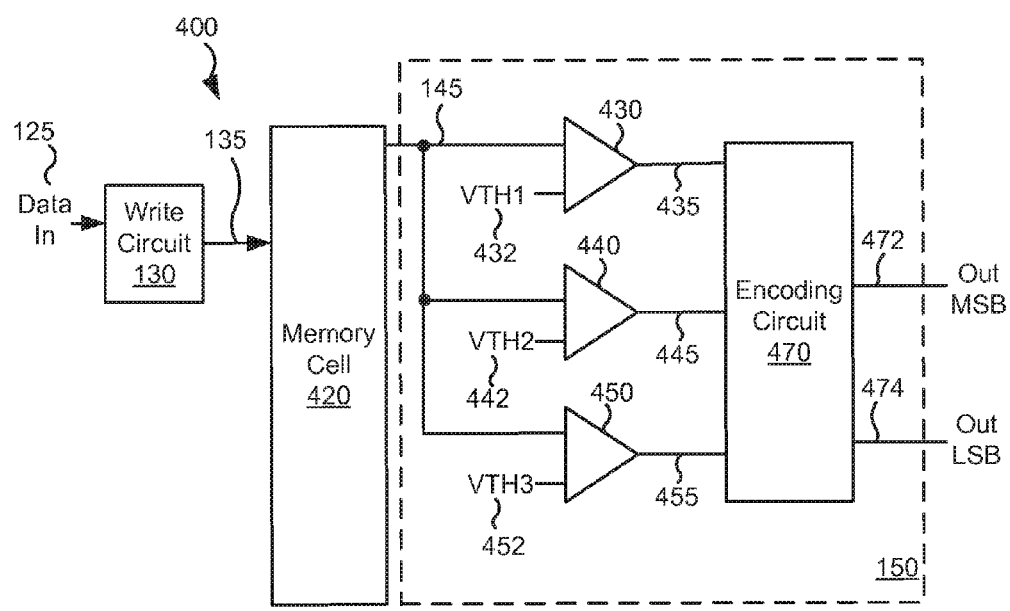
FIG. 4 shows one implementation of the data read and write data circuitry of FIG. 1 for a two bit per cell memory device.

Turning to FIG. 4, a detailed implementation 400 of read circuit along with other elements of the storage device of FIG. 1a that may be used in relation to one or more embodiments of the present invention. As shown in implementation 400, read circuit 150 receives read voltage 145 from a memory cell 420 and compares it against three thresholds (VTH1, VTH2, VTH3) using respective threshold comparator circuits 430, 440, 450. Memory cell 420 represents one cell of flash memory cells 140. Where read voltage 145 is less than threshold VTH1, all of a comparison output 435 from threshold comparator circuit 430, a comparison output 445 from threshold comparator circuit 440, and a comparison output 455 from threshold comparator circuit 450 are asserted low. Alternatively, where read voltage 145 is less than threshold VTH2 and greater than threshold VTH1, comparison output 435 is asserted high, and both comparison output 445 and comparison output 455 are asserted low. Where read voltage 145 is greater than threshold VTH2 and threshold VTH1, but less than threshold VTH3, both comparison output 435 and comparison output 445 are asserted low, and comparison output 455 is asserted high. Alternatively, where read voltage 145 is greater than all of threshold VTH1, threshold VTH2, and threshold VTH3, all of comparison output 435, comparison output 445, and comparison output 455 are asserted high.

An encoding circuit 470 encodes comparison output 435, comparison output 445, and comparison output 455 into a two bit output (MSB 472, LSB 474). The following table shows the encoding:

| Comparison Outputs | Two Bit Data Input |
|---|---|
| '111' | '11' |
| '110' | '10' |
| '100' | '00' |
| '000' | '01' |

The combination of MSB 472 and LSB 474 are provided as multi-bit read data 155. An example of the threshold values (VTH1, VTH2, VTH3) relative to states corresponding to the different values of MSB 472 and LSB 474 is shown in FIG. 2.

Figure 1B:
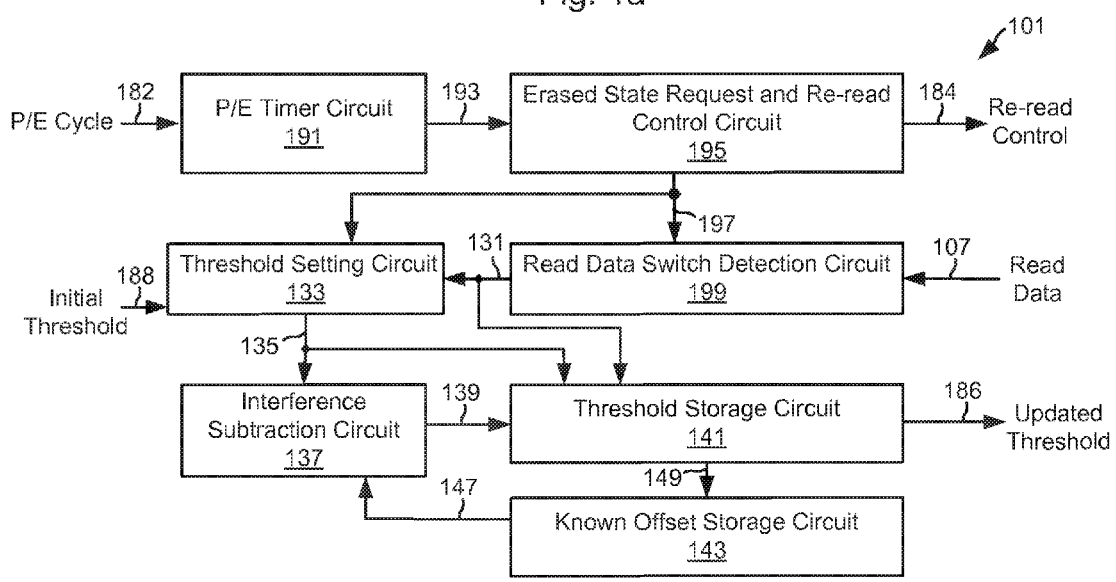
FIG. 1b shows one implementation of the erased state characterization circuit in accordance with various embodiments of the present invention.

Turning to FIG. 1b, one implementation of an erased state characterization circuit 101 is shown in accordance with various embodiments of the present invention. Erased state characterization circuit 101 may be used in place of erased state characterization circuit 180 of FIG. 1a. As shown, erased state characterization circuit 101 includes an erased state request and re-read control circuit 195, a program and erase (P/E) timer circuit 191, a read data switch detection circuit 199, a threshold setting circuit 133, an interference subtraction circuit 137, and a threshold storage circuit 141.

P/E timer circuit 191 receives P/E cycle input 182 and increments a P/E count value 193 each time P/E cycle input 182 is asserted. P/E count value 193 is provided to an erased state request and re-read control circuit 195. Erased state request and re-read control circuit 195 is a state machine that controls the processes of defining a sub-zero threshold value. The result of the state machine is provided as re-read control 184. In particular, when the P/E count value 193 exceeds a threshold (e.g., 100), a wordline to be characterized is selected as a defined wordline and re-read control 184 is set to program all cells associated with the defined wordline to a known state (e.g., State B shown in FIG. 2). In addition, all cells associated with one direct neighbor of the defined wordline are programmed to the next program state (e.g., State C in FIG. 2) and all cells associated with the other direct neighbor of the defined wordline are programmed to the next program state (e.g., State C in FIG. 2).

Figure 3:
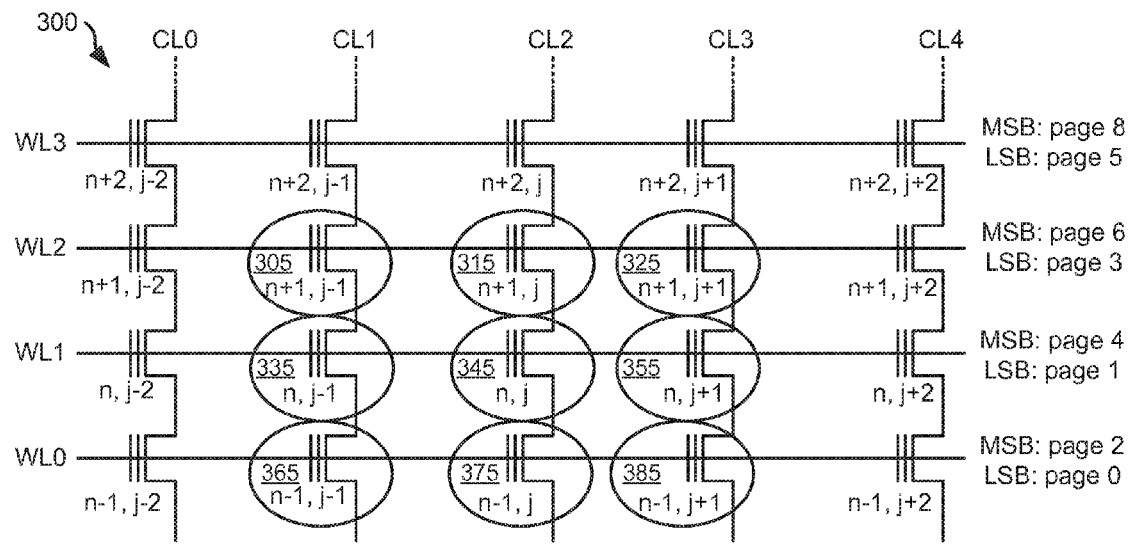
FIG. 3 shows a selection of cells from a solid state memory device showing a number of wordlines and column lines.

FIG. 3 shows a selection of cells from a solid state memory device 300 showing a number of wordlines (WL0, WL1, WL2, WL3) and column lines (CL0, CL1, CL2, CL3, CL4). In this case, wordline WL1 is selected as the defined wordline and includes at least cells 335, 345, 355. Wordline WL0 including at least cells 365, 375, 385 is one of the direct neighbors of the defined wordline, and wordline WL2 including at least cells 305, 315, 325 is the other of the direct neighbors of the defined wordline. Thus, using the preceding description of FIG. 1b, cells 335, 345, 355 are programmed to the known state (e.g., State B in FIG. 2) and cells 305, 315, 325, 365, 375, 385 are programmed to the next state (e.g., State B in FIG. 2). The charge on all of cells 305, 315, 325, 365, 375, 385 have an impact on the voltage read from cell 345. Where the voltage on cell 345 is at a first level, charging all of the cells around cell 345 to the next level results in a positive shift in the voltage distribution shown in FIG. 2. In particular, the expected voltage distribution corresponding to the value programmed into cell 345 on the defined wordline is shifted to the right (i.e., toward State C of the distribution of FIG. 2).

Erased state request and re-read control circuit 195 causes the cells on the defined wordline to be read resulting in read data 107, and erased state request and re-read control circuit 195 provides a read indicator 197 to a read data switch detection circuit 199. Read data switch detection circuit 199 receives read data 107 and determines whether it changes from one read to the next. Initially, threshold setting circuit 133 sets the threshold between the state to which the defined wordline is programmed and the state to which the neighbor wordlines are programmed (e.g., between State B and State C). Threshold setting circuit 133 initially sets a threshold value 135 the value received as initial threshold 188. Initial threshold 188 is selected as a threshold that is well within the voltage distribution of the value originally programmed (e.g., State B) to the defined wordline. After each read as indicated by read indicator 197, threshold value 135 is incremented toward the voltage distribution for the next state (e.g., State C). This process continues until read data switch detection circuit 199 indicates a change in read data 107 (i.e., the value read from a cell on the define wordline is repeatedly compared against different threshold values until the output of the threshold comparison changes) as a state change output 131.

Each instance of threshold value 135 is provided to interference subtraction circuit 137 and threshold storage circuit 141. Threshold storage circuit 141 maintains the threshold value prior to beginning the multiple read process and stores threshold value 135 after each read. Threshold value 135 is provided as updated threshold 186 where it is used as part of thresholds 154. When state change output 131 indicates a change in read data 107, threshold value 135 stored to threshold storage circuit 141 and the prior threshold value are provided as thresholds 149 to a known offset storage circuit 143. Known offset storage circuit 143 subtracts the prior threshold from threshold value 135 to yield a known voltage shift 147. With the known voltage shift 147 established, the prior threshold value is re-established as updated threshold 186.

After establishing known voltage shift 147, erased state request and re-read control circuit 195 then causes the cells on the defined wordline to be erased (e.g., placed in the ERASE state of FIG. 2), and all cells associated with one direct neighbor of the defined wordline programmed to the next program state (e.g., State A in FIG. 2) and all cells associated with the other direct neighbor of the defined wordline are programmed to the next program state (e.g., State A in FIG. 2). The interference resulting on the defined wordline causes the ERASE State to shift toward State A such that at least a portion of the voltage distribution of the ERASE State is not a sub-zero value. With this shift into a positive voltage region, the point between the ERASE state and the next state (e.g., State A) is discernible.

Erased state request and re-read control circuit 195 causes the defined wordline to be read and re-read resulting in read data 107, and erased state request and re-read control circuit 195 provides read indicator 197 to read data switch detection circuit 199. Read data switch detection circuit 199 receives read data 107 and determines whether it changes from one read to the next. Initially, threshold setting circuit 133 sets the threshold between the state to which the defined wordline is programmed and the state to which the neighbor wordlines are programmed (e.g., between ERASE State and State A). Threshold setting circuit 133 initially sets a threshold value 135 the value received as initial threshold 188. Initial threshold 188 is selected as a threshold that is well within the voltage distribution of the value originally programmed (e.g., zero volts) to the defined wordline. After each read as indicated by read indicator 197, threshold value 135 is incremented toward the voltage distribution for the next state (e.g., State A). This process continues until read data switch detection circuit 199 indicates a change in read data 107 (i.e., the value read from a cell on the define wordline is repeatedly compared against different threshold values until the output of the threshold comparison changes) as a state change output 131.

Each instance of threshold value 135 is provided to interference subtraction circuit 137 and threshold storage circuit 141. Threshold storage circuit 141 maintains the threshold value prior to beginning the multiple read process and stores threshold value 135 after each read. Before assertion of state change output 131, threshold value 135 is provided as updated threshold 186 where it is used as part of thresholds 154. When state change output 131 is asserted indicating a change in read data 107, the threshold between the ERASE State and the next state shifted by known voltage shift 147 is represented by threshold value 135. Thus, by removing known voltage shift 147 from threshold value 135 provides the non-shifted, desired threshold between the ERASE State and the next state. This non-shifted, desired threshold may be a sub-zero value which is otherwise not discernable as threshold values 154 provided to read circuit 150 cannot be negative values. To obtain the non-shifted, desired threshold between the ERASE State and the next state, interference subtraction circuit 137 subtracts known voltage shift 147 from threshold value 135 to yield a non-shifted, desired threshold 139 that is stored by threshold storage circuit 141 in place of the prior threshold value.

Of note, the preceding process operates to discern the threshold value between the ERASE State and the next state. The threshold values between the next states (e.g., the threshold between State A and State B, and the threshold between State B and State C) can be established directly. In particular, these thresholds can be determined by writing all cells (both the defined wordline and the neighboring wordlines) with a non-erase state, and then incrementally testing thresholds between the written state and the next state until a switch in read value 107 is detected with the threshold at the point where the change in read value 107 being detected is the newly established threshold value. There is not a need to program neighboring wordlines to cause predictable interference as the thresholds between the upper states are not sub-zero values.

Figure 5:
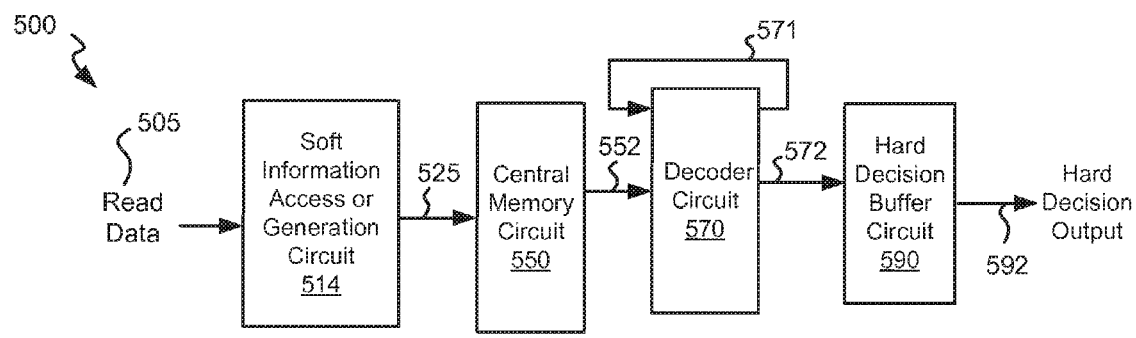
FIG. 5 depicts one implementation of an iterative data processing circuit that may be used in relation to embodiments of the present invention.

Turning to FIG. 5, an implementation of an iterative data processing circuit 500 is shown that may be used in relation to embodiments of the present invention. Iterative data processing circuit 500 may be used in place of iterative data processing circuit 170 of FIG. 1. Iterative data processing circuit 500 includes a soft information generation circuit 514 that generates soft information 525. In some embodiments of the present invention, soft information access or generation circuit 514 merely passes on soft information available from read circuit 150 of FIG. 1. In other embodiments of the present invention, the soft data may be generated. Such generation of soft data may be done using any approach known in the art for generating soft data. As one example, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application is incorporated herein by reference for all purposes. Soft information 525 is stored to a central memory circuit 550.

A decoder circuit 570 operates on a decoder input 552 that corresponds to soft information 525 stored to central memory circuit 550. The soft information represents a probability that the hard data was properly detected (i.e., properly sensed from the memory cells). In one particular embodiment of the present invention, data decoder circuit 570 is a low density parity check decoder circuit. Data decoder circuit 570 applies a data decoding algorithm to decoder input 552 to yield a decoded output 571.

Where decoded output 571 converges, no further operation is applied to decoder input 552, and a resulting decoded output 572 is provided to a hard decision buffer circuit 590. Hard decision buffer circuit 590 converts decoded output 572 to a series of hard decisions, and provides the result as a hard decision output 592. Alternatively, where decoded output 571 fails to converge, the result is stored back to central memory circuit 550 as a decoded output 554. Subsequently, decoder circuit 570 re-applies the data decode algorithm to decoder input 552 guided by decoded output 571. This process is repeated until all remaining errors are corrected or until a timeout condition (i.e., a maximum number of iterations through decoder circuit 570) have occurred.

Figure 6A:
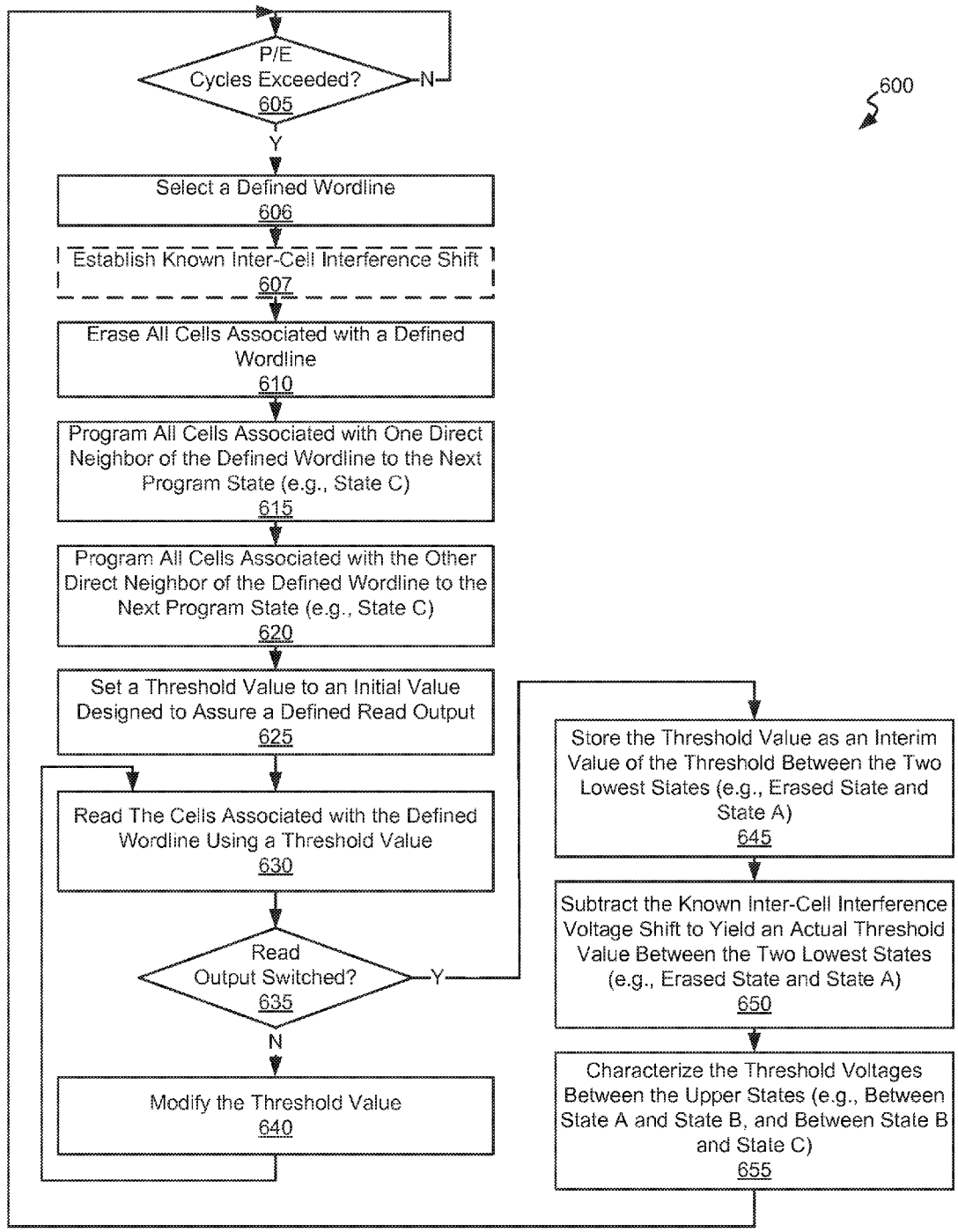
FIGS. 6a-6b are flow diagrams showing a method in accordance with some embodiments of the present invention for characterizing a solid state memory device.
Figure 6B:
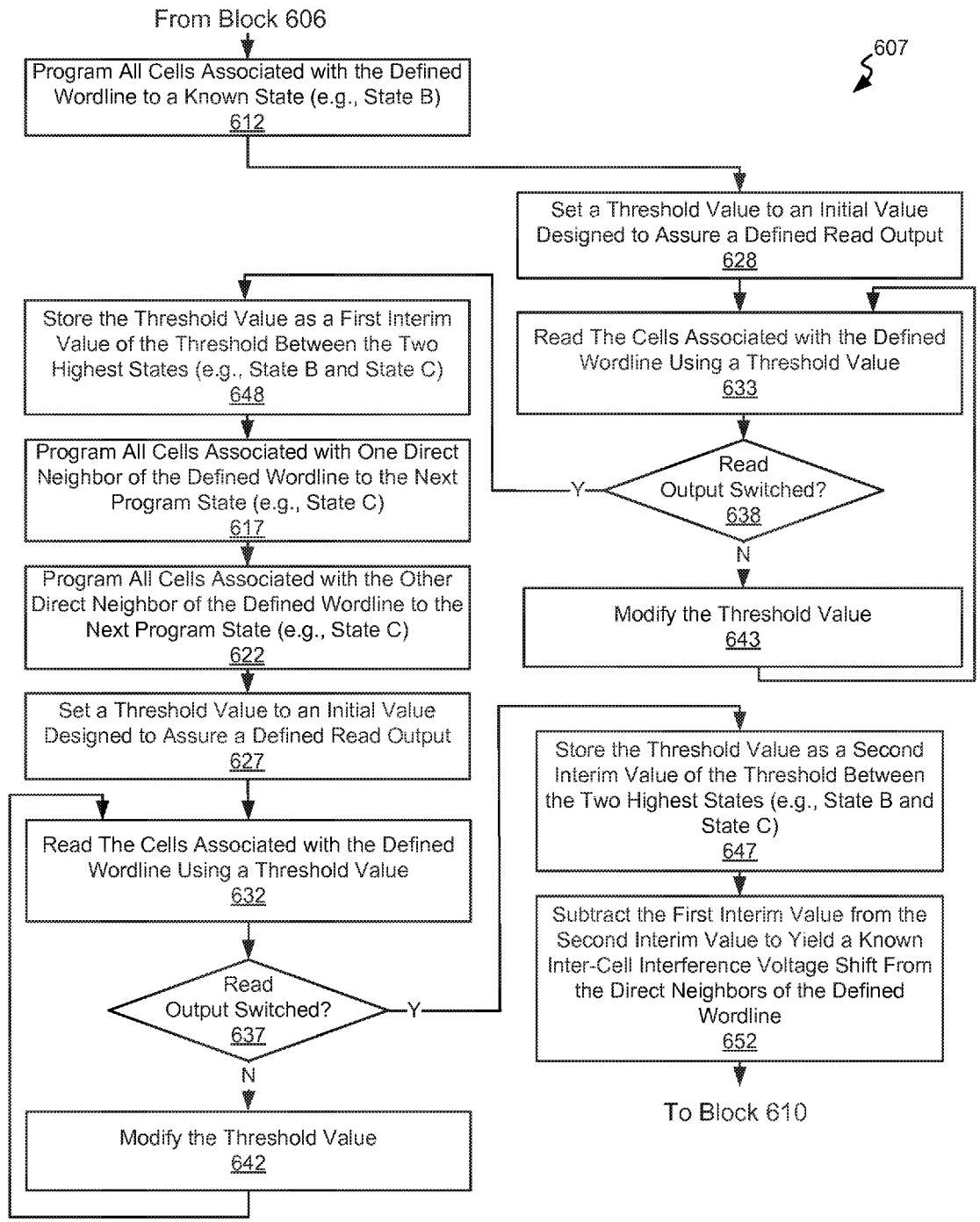

Turning to FIGS. 6a-6b, flow diagrams 600, 607 show a method in accordance with some embodiments of the present invention for characterizing a solid state memory device. Following flow diagram 600 of FIG. 6a, it is determined whether the number of program and erase (P/E) cycles have occurred (block 605). In some embodiments of the present invention, the processes of flow diagrams 600, 607 are repeated every one hundred P/E cycles. Based upon the disclosure provided herein, one of ordinary skill in the art will recognize a different number of P/E cycles between re-application of the processes of flow diagrams 600, 607. Where the number of P/E cycles exceeds the threshold (block 605), a defined wordline is selected (block 606). This may include, for example, selecting a wordline of a solid state storage device to be characterized. Using the example of FIG. 3, wordline WL1 is selected.

The processes of flow diagram 607 are then performed to establish a known inter-cell interference voltage shift (block 607). Turning to FIG. 6b and following flow diagram 607, all cells associated with the defined wordline are programmed to a known state (block 612). This known state may be, for example, State B shown in FIG. 2. A threshold for discerning between the voltage stored to the defined wordline and the voltage stored to the neighboring wordlines is set to an initial value (block 628). The initial threshold is selected such that it will detect part of the voltage distribution corresponding to the value stored to the defined wordline. The cells associated with the defined wordline are read using the threshold value to yield a read output (block 633). The voltage read from the cells is converted to a binary value as discussed above in relation to FIG. 4 above. It is determined whether the read output has changed between reads (block 638). Where the read output has not changed between reads using different threshold values (block 638), the threshold value is modified (block 643). The modification may be, for example, an incremental change from the current threshold value toward the voltage stored to the neighboring wordlines. The processes of blocks 633-638 are then repeated for the updated threshold value. Alternatively, where the read output changes between reads using different threshold values (block 638), the threshold value is stored as a first interim value of the threshold between the two states (i.e., between the voltage to which cells of the defined wordline are programmed and the voltage to which cells of the neighboring wordlines are programmed) (block 648).

In addition, all cells associated with one direct neighbor of the defined wordline are programmed to a next program state (block 617). Using device 300 of FIG. 3, the direct neighbor may be wordline WL0, and the next program state may be, for example, State C of FIG. 2. Similarly, all cells associated with the other direct neighbor of the defined wordline are programmed to the next program state (block 622). Again, using device 300 of FIG. 3, the other direct neighbor may be wordline WL2. Programming the defined wordline to one state, and programming the neighboring wordlines to another state results in an interference that shifts the voltage distribution corresponding to that written to the defined wordline more toward the voltage distribution corresponding to that written to the neighboring wordlines. A threshold for discerning between the voltage stored to the defined wordline and the voltage stored to the neighboring wordlines is set to an initial value (block 627). The initial threshold is selected such that it will detect part of the voltage distribution corresponding to the value stored to the defined wordline. The cells associated with the defined wordline are read using the threshold value to yield a read output (block 632). The voltage read from the cells is converted to a binary value as discussed above in relation to FIG. 4 above. It is determined whether the read output has changed between reads (block 637). Where the read output has not changed between reads using different threshold values (block 637), the threshold value is modified (block 642). The modification may be, for example, an incremental change from the current threshold value toward the voltage stored to the neighboring wordlines. The processes of blocks 632-637 are then repeated for the updated threshold value.

Alternatively, where the read output changes between reads using different threshold values (block 637), the threshold value is stored as a second interim value of the threshold between the two states (i.e., between the voltage to which cells of the defined wordline are programmed and the voltage to which cells of the neighboring wordlines are programmed) (block 647). The first interim value is then subtracted from the second interim value to yield the known inter-cell interference voltage shift (block 652).

With the known inter-cell interference voltage shift established (block 607), processing returns to flow diagram 600 of FIG. 6a. Following flow diagram 6a, all cells associated with the defined wordline are programmed to an ERASE State (block 610). This known state may be, for example, ERASE shown in FIG. 2. In addition, all cells associated with one direct neighbor of the defined wordline are programmed to a next program state (block 615). Using device 300 of FIG. 3, the direct neighbor may be wordline WL0, and the next program state may be, for example, State A of FIG. 2. Similarly, all cells associated with the other direct neighbor of the defined wordline are programmed to the next program state (block 620). Again, using device 300 of FIG. 3, the other direct neighbor may be wordline WL2. Programming the defined wordline to the ERASE State, and programming the neighboring wordlines to another state results in an interference that shifts the voltage distribution corresponding to that written to the defined wordline more toward the voltage distribution corresponding to that written to the neighboring wordlines. The interference corresponds to the previously established known inter-cell interference voltage shift.

A threshold for discerning between the voltage stored to the defined wordline and the voltage stored to the neighboring wordlines is set to an initial value (block 625). The initial threshold is selected such that it will detect part of the voltage distribution corresponding to the value stored to the defined wordline as shifted due to the known inter-cell interference voltage shift. The cells associated with the defined wordline are read using the threshold value to yield a read output (block 630). The voltage read from the cells is converted to a binary value as discussed above in relation to FIG. 4 above. It is determined whether the read output has changed between reads (block 635). Where the read output has not changed between reads using different threshold values (block 635), the threshold value is modified (block 640). The modification may be, for example, an incremental change from the current threshold value toward the voltage stored to the neighboring wordlines. The processes of blocks 630-635 are then repeated for the updated threshold value.

Alternatively, where the read output changes between reads using different threshold values (block 635), the threshold value is stored as an interim value of the threshold between the two states (i.e., between the voltage to which cells of the defined wordline are programmed and the voltage to which cells of the neighboring wordlines are programmed) (block 645). The known inter-cell interference voltage shift is then subtracted from the interim value to yield an actual threshold value between the two lowest states (e.g., ERASE State and State A) (block 650). Thus, by removing the known inter-cell interference voltage shift from the interim value, a non-shifted, desired threshold between the ERASE State and the next state is generated. This non-shifted, desired threshold may be a sub-zero value which is otherwise not discernable as threshold values used to read the cells (see e.g., block 630) cannot be negative values.

The threshold values between the upper states (e.g., VTH2 and VTH3 of FIG. 2) are then characterized (block 655). Of note, the preceding process operates to discern the threshold value between the ERASE State and the next state that may be a sub-zero threshold. The threshold values between the next states (e.g., the threshold between State A and State B, and the threshold between State B and State C) can be established directly as they are not sub-zero. In particular, these thresholds can be determined by writing all cells (both the defined wordline and the neighboring wordlines) with a non-erase state, and then incrementally testing thresholds between the written state and the next state until a switch in a received read value is detected with the threshold at the point where the change in the read value being detected is the newly established threshold value. There is not a need to program neighboring wordlines to cause predictable interference as the thresholds between the upper states are not sub-zero values.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A memory system, comprising:
   a memory cell characterization circuit operable to:
   program a first cell of a solid state memory device to a negative voltage;
   program a second cell of the solid state memory device to a positive voltage;
   detect a voltage shift in the first cell when the second cell is being programmed;
   characterize the negative voltage of the first cell offset by the voltage shift as an interim voltage of the first cell; and
   calculate an actual voltage based on the voltage shift and the interim voltage.

2. The memory system of claim 1, wherein detecting the voltage shift includes detecting inter-cell interference on the programmed first cell when the second cell is being programmed.

3. The memory system of claim 1, wherein calculating the actual voltage comprises subtracting the voltage shift from the interim voltage.

4. The memory system of claim 1, wherein the first and second cells are arranged adjacent to each other.

5. The memory system of claim 1, wherein the voltage level on the first cell is a first voltage level, wherein the positive voltage is a first positive voltage, and wherein the memory cell characterization circuit is further operable to:
   write the first cell of the solid state memory device to a second positive voltage;
   characterize a second voltage level on the first cell;
   write the second cell of the solid state memory device to a third positive voltage, wherein writing the second cell to the third positive voltage interferes with the second positive voltage written to the first cell such that the voltage on the first cell is the second positive voltage offset by a second voltage shift;
   characterize a third voltage level on the first cell; and
   subtract the second voltage level from the third voltage level to yield the voltage shift.

6. The memory system of claim 5, wherein the second voltage shift includes at least a first interference component and a second interference component, wherein the first interference component is due to interference from the second cell on the first cell, wherein the second memory cell is included in a first wordline adjacent to a defined wordline including the first cell, and wherein the memory cell characterization circuit is further operable to:
   write a third cell of the solid state memory device to the first positive voltage, wherein the third cell is included in a second wordline adjacent to the defined wordline, and wherein the third cell results in the second interference component interfering with the first cell.

7. The memory system of claim 5, wherein:
   characterizing the negative voltage on the first cell as the interim voltage includes repeatedly reading the interim voltage of the first cell using a first set of incrementally adjusted voltage values until an output of the first cell changes to distinguish between a first state and a second state of the first cell; and
   characterizing the third voltage on the first cell includes repeatedly reading the first cell using a second set of incrementally adjusted voltage values until the output of the first cell changes to distinguish between a third state and a fourth state of the first cell.

8. The memory system of claim 7, wherein all of the different values of the first set of incrementally adjusted voltage values are greater than or equal to zero, and wherein all of the different values of the second set of incrementally adjusted voltage values are greater than or equal to zero.

9. The memory system of claim 1, wherein the actual voltage is used to set a first threshold value for distinguishing between a first state and a second state of the first memory cell.

10. The memory system of claim 1, wherein the memory system is implemented as part of an integrated circuit.

11. The memory system of claim 1, wherein the system further comprises:
    the solid state memory device, and wherein the memory cell characterization circuit and the solid state memory device are implemented on the same integrated circuit.

12. The memory system of claim 1, wherein the solid state memory device includes a number of flash memory cells, each of the flash memory cells being able to hold a charge distinguishable as two bits of data.

13. A method for characterizing a solid state memory device, the method comprising:
- programming a negative voltage to a first cell of a solid state memory device;
- programming a positive voltage to a second cell of the solid state memory device;
- detecting a voltage shift on the first cell when the second cell is being programmed;
- characterizing the negative voltage of the first cell offset by the voltage shift as an interim voltage of the first cell; and
- calculating an actual voltage based on the voltage shift and the interim voltage.

14. The method of claim 13, wherein the second cell is adjacent to the first cell.

15. The method of claim 13, wherein the voltage shift occurs based on inter-cell interference on the programmed first cell.

16. The method of claim 13, wherein calculating the actual voltage includes subtracting the voltage shift from the interim voltage.

17. An electronic device, comprising:
- a solid state memory device; and
- a memory cell characterization circuit operable to:
  - program a first cell of a solid state memory device to a negative voltage;
  - program a second cell of the solid state memory device to a positive voltage;
  - detect a voltage shift in the first cell when the second cell is being programmed;
  - characterize the negative voltage of the first cell offset by the voltage shift as an interim voltage of the first cell; and
  - calculate an actual voltage based on the voltage shift and the interim voltage.

18. The electronic device of claim 17, wherein the first and second cells are arranged adjacent to each other, and calculating the actual voltage includes subtracting the voltage shift from the interim voltage.

19. The electronic device of claim 17, wherein the voltage level on the first cell is a first voltage level, wherein the positive voltage is a first positive voltage, and wherein the memory cell characterization circuit is further operable to:
- write the first cell of the solid state memory device to a second positive voltage;
- characterize a second voltage level on the first cell;
- write the second cell of the solid state memory device to a third positive voltage, wherein writing the second cell to the third positive voltage interferes with the second positive voltage written to the first cell such that the voltage on the first cell is the second positive voltage offset by a second voltage shift;
- characterize a third voltage level on the first cell; and
- subtract the second voltage level from the third voltage level to yield the voltage shift.

* * * * *